United States Patent
Kim et al.

(10) Patent No.: US 6,663,245 B2
(45) Date of Patent: Dec. 16, 2003

(54) APPARATUS FOR SUBSTRATE CLEANING OF LIQUID CRYSTAL DISPLAY AND METHOD FOR SUBSTRATE CLEANING USING IT

(75) Inventors: Man Suk Kim, Kyoungki-do (KR); Jae Kyoung Ryou, Seoul (KR)

(73) Assignee: Boe-Hydis Technology Co., Ltd., Kyoungki-do (KR)

( * ) Notice: Subject to any disclaimer, the term of this patent is extended or adjusted under 35 U.S.C. 154(b) by 0 days.

(21) Appl. No.: 10/154,387

(22) Filed: May 23, 2002

(65) Prior Publication Data

US 2003/0072081 A1 Apr. 17, 2003

(30) Foreign Application Priority Data

May 25, 2001 (KR) .......................................... 2001-29093

(51) Int. Cl.[7] .................................................. G02B 5/08
(52) U.S. Cl. .......................................... 359/508; 134/33
(58) Field of Search ................................. 359/507, 508; 134/32, 33, 153, 144

(56) References Cited

U.S. PATENT DOCUMENTS 6,357,457 B1 * 3/2002 Taniyama et al. ......... 134/57 R

* cited by examiner

Primary Examiner—Euncha Cherry
(74) Attorney, Agent, or Firm—Ladas & Parry

(57) ABSTRACT

Disclosed is an apparatus for substrate cleaning of liquid crystal display capable of desirably controlling the exhaust pressure and a method for substrate cleaning using it. The disclosed comprises a spin dry cup having a rotation device for rotating substrate, an air absorber arranged on the external of the spin dry cup to absorb impurities exhausted from the rotating substrate with air, a trap for exhausting air and impurities absorbed from the air absorber to the external, an exhaust pressure control part arranged in the trap to control exhaust pressure of the trap, and a drain arranged in the trap to exhaust chemicals and water from the rotating substrate to the external.

4 Claims, 3 Drawing Sheets

APPARATUS FOR SUBSTRATE CLEANING OF LIQUID CRYSTAL DISPLAY AND METHOD FOR SUBSTRATE CLEANING USING IT

BACKGROUND OF THE INVENTION

1. Field of the Invention

The present invention relates to a method for substrate cleaning of liquid crystal display and, more particularly, to an apparatus for substrate cleaning of liquid crystal display capable of controlling exhaust during substrate cleaning and a method of substrate cleaning using it.

2. Description of the Related Art

As is generally known, liquid crystal display manufacturing methods comprise an array process and a cell process. The array process includes the steps of making film and forming fine patterns on a lower glass substrate by photolithography and the cell process includes the steps of implanting liquid crystals by adhering the lower glass substrate and an upper glass substrate as a color filter substrate, wherein cleaning processes are performed to remove injurious impurities on the substrates during the processes. The cleaning process makes up 20~30% of whole process, removing different impurities in each process, thereby it is required to provide different cleaning apparatus by the process.

The cleaning apparatus is divided into a batch type and sheet fed type. In the batch type, substrates are cleaned by a cassette unit. On the other hand, the sheet fed type comprises the steps of carrying a plurality of substrates, cleaning the substrates with brush or ultrasonic waves and drying them with air knife or spin dry. The sheet fed type can be advantageously applied to large scale substrates.

FIG. 1 is a drawing showing an apparatus for substrate cleaning and a method for substrate cleaning using it according to a conventional art, wherein a substrate cleaning apparatus is provided with spin dry unit.

As shown in FIG. 1, the spin dry unit 10 comprises a spin dry cup 15 having a rotation device 12 for rotating a substrate 14, an exhaust duct 18 arranged on the lower part of spin dry cup 15 to exhaust impurities, chemicals and water from the rotating substrate 14 to external and an exhaust damper arranged on the exhaust duct 18 to control exhaust volume.

The substrate cleaning method using the above-mentioned apparatus will be described in the following.

First, a substrate 14 is rotated on a predetermined rotation device 12, thereby exhausting impurities of the substrates 14 to an exhaust duct 18 through a normally open exhaust damper 16 by centrifugal force and airflow.

FIG. 2 shows an example of substrate cleaning apparatus of liquid crystal display device according to a conventional art.

As shown in FIG. 2, the substrate cleaning apparatus comprises 9 devices and 3 spin dry units are connected to each device, thereby amounting to 27 spin dry units. All of the 27 spin dry units are connected to a main duct 20 to exhaust waste gas from each spin dry unit to external through the main duct 20.

However, the conventional substrate cleaning apparatus having a spin dry unit and the substrate cleaning method using it have several problems as follows.

As the size of liquid crystal panel is increased, the rotation speed is also increased, thereby providing great centrifugal force to impurities on the substrate. Therefore, impurities are frequently bumped against the wall of spin dry unit by rising currents and returned to the substrate. In order to solve the problem, large amount of air is absorbed from the external and much exhaust is required during substrate cleaning. When exhaust is insufficient, that is, exhaust pressure is not sufficiently provided in each unit, defective rates are increased by rising currents due to centrifugal force during spin dry process.

SUMMARY OF THE INVENTION

Therefore, the present invention has been proposed to solve the problems of conventional arts and an object of the present invention is to provide a substrate cleaning apparatus of liquid crystal display capable of reducing the manufacturing cost and improving process margin by reinforcing down flow in the device with small amount of exhaust, wherein a normally open mode of spin dry unit is changed into a normally close mode by signal modification and recipe modification.

Another object of the present invention is to provide a substrate cleaning method of liquid crystal display capable of reducing the manufacturing cost and improving process margin by reinforcing down flow in the device with small amount of exhaust, wherein a normally open mode of spin dry unit is changed into a normally close mode by signal modification and recipe modification.

In order to accomplish the above objects, the substrate cleaning apparatus of the present invention comprises: a spin dry cup having a rotation device for rotating a substrate; an air absorber arranged on the external of the spin dry cup to absorb air and impurities exhausted from the rotating substrate; a trap for exhausting air and impurities absorbed from the air absorber to the external; an exhaust pressure control unit arranged on the trap to control exhaust pressure therein; and a drain arranged on the trap to exhaust chemicals and water from the rotating substrate to the external.

The substrate cleaning method using the present substrate cleaning apparatus comprises the steps of: providing a substrate cleaning apparatus according to claim 3; loading the substrate on a rotation device; and closing a manual damper by hand operation and then automatically operating an auto damper when the substrate is loaded on the rotation device and cleaning process is performed.

DETAILED DESCRIPTION OF THE INVENTION

The objects and features of the invention may be understood with reference to the following detailed description of an illustrative embodiment of the invention, taken together with the accompanying drawings.

Figure 3:
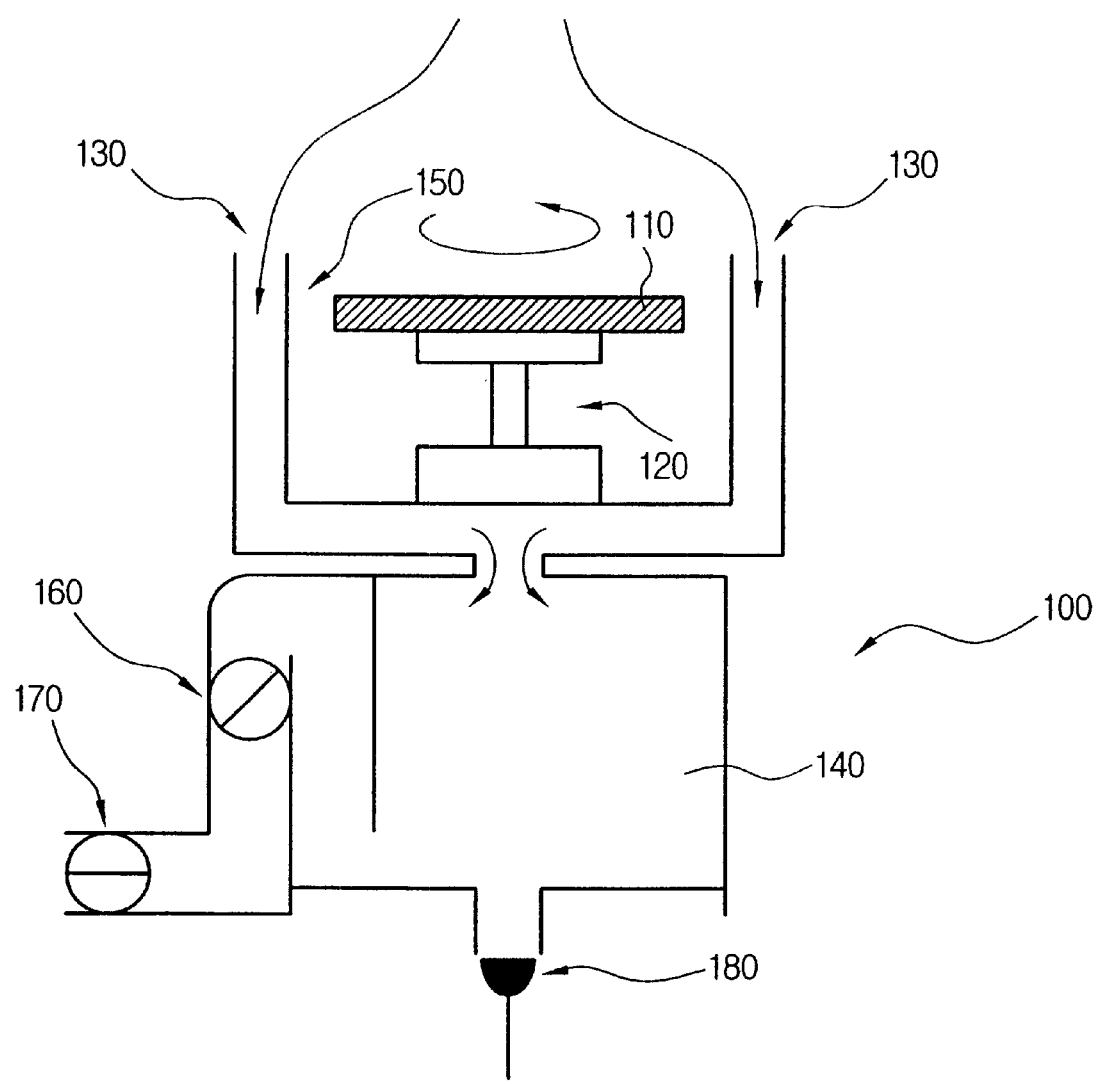
FIG. 3 is a drawing showing a substrate cleaning apparatus according to the present invention and a substrate cleaning method using it.

FIG. 3 is a drawing showing a substrate cleaning apparatus according to the present invention and a substrate cleaning method using it, wherein the substrate cleaning apparatus is provided with a spin dry unit.

The present substrate cleaning apparatus includes a spin dry unit 100 comprising a series of devices for cleaning and drying substrates.

As shown in FIG. 3, the spin dry unit 100 comprises a spin dry cup 150 having a rotation device 120 for rotating a substrate 110, an air absorber 130 arranged on the external of the spin dry cup 150 to absorb air and impurities exhausted from the rotating substrate 110, a mist trap 140 for exhausting air and impurities absorbed from the air absorber 130 to the external, a manual damper 160 and auto damper 170 arranged on the mist trap 140 to control exhaust pressure in the trap 140, and a drain 180 arranged on the mist trap 140 to exhaust chemicals and waters from the rotating substrate 110 to the external. The open and close of the manual damper 160 is controlled by hand operation and the auto damper 170 is set to open only when the substrate 110 is loaded on the rotation device 120 and cleaning process is performed.

And, the auto damper 170 is connected to a main duct (not illustrated) in order to flow out exhaust to the external.

A substrate cleaning method using the apparatus will be described in the following.

As shown in FIG. 3, the substrate 110 is arranged on the rotation device 120 in the spin dry cup 150 and the substrate 110 is rotated by the rotation device, thereby chemicals and water used for the substrate cleaning are flowed into the mist trap 140 with impurities on the substrate surface 110 by centrifugal force and air flow absorbed into the air absorber 130.

Various materials are mixed in the mist trap 140, including impurities on the surface of substrate 110 and chemicals for substrate cleaning, wherein chemicals and liquid impurities are exhausted to the external through a drain 180 arranged on the lower part of the mist trap 140.

And, impurities in the mist trap 140 are exhausted to the external using the manual damper 160 and the auto damper 170. Here, the open and close of manual damper 160 is controlled by hand operation and the auto damper 170 is set to have normally close mode and to open only when the substrate 110 is loaded on the rotation device 120 and cleaning process is performed.

Therefore, the spin dry unit 100 is not operated since the dampers 160,170 have normally close mode except that the substrate 110 is loaded on the rotation device 120 of the spin dry unit 100 to perform cleaning and dry processes. As a result, it is possible to reduce the volume of exhaust and supply sufficient exhaust pressure to other spin dry unit in operation.

When the substrate 110 is loaded on the rotation device 120 of the spin dry unit 100 to perform cleaning and dry processes, the auto damper 170 is set to open and the spin dry unit 100 is operated. The spin dry unit 100 is operated by modifying a RECIPE defining operation time and pause time of the spin dry unit 100.

The following tables show the result of test on the various conditions according to the present invention.

(TEST 1)

Figure 1:
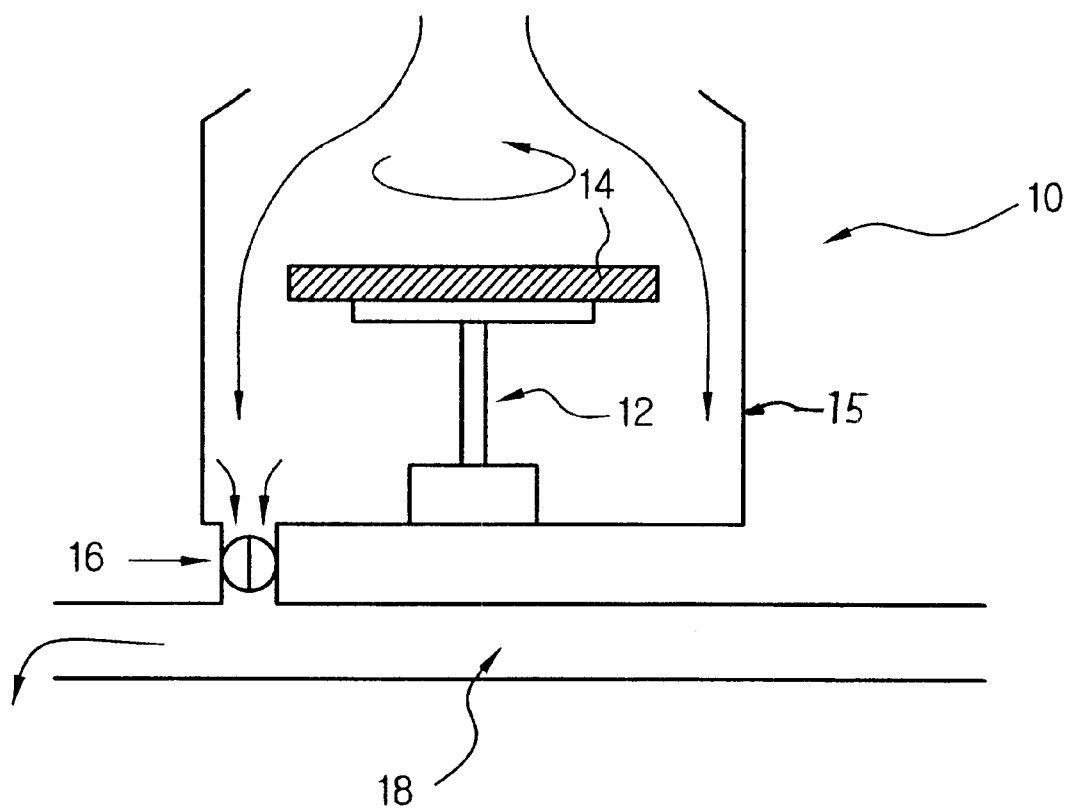
FIG. 1 is a drawing showing a conventional substrate cleaning apparatus and a substrate cleaning method using it.
Figure 2:
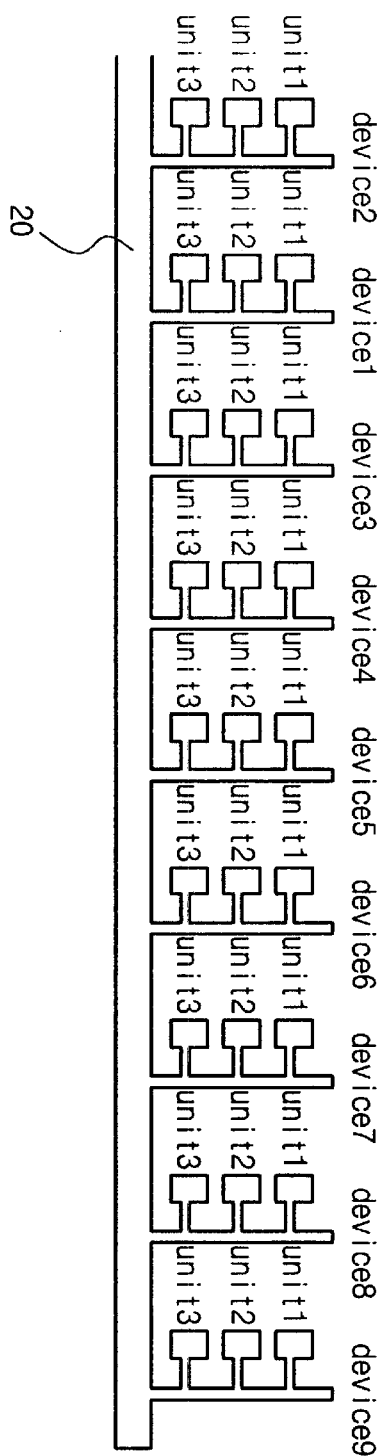
FIG. 2 is a drawing showing an example for using the conventional substrate cleaning apparatus.

The table 1 shows the exhaust pressure of spin dry units (units 1 to 3) connected to devices 1 to 9 when all dampers of substrate cleaning device are opened in the conventional spin dry unit of FIG. 1, for example, TEL TRACK DEVELOPER, wherein the unit is Pa.

TABLE 1

|   | Average of | Grand mean |
|---|---|---|
| D | 317 | 286 |
| D | 233 | |
| D | 233 | |
| D | 190 | |
| D | 333 | |
| D | 293 | |
| D | 350 | |
| D | 260 | |
| D | 360 | |

(TEST 2)

The table 2 shows the exhaust pressure of spin dry units (units 1 to 3) connected to devices 2 to 9 when the damper of device 1 is closed in the conventional spin dry unit of FIG. 1, for example, TEL TRACK DEVELOPER, wherein the unit is Pa.

TABLE 2

|   | Average of | Grand mean |
|---|---|---|
| D | 273 | 303 |
| D | 270 | |
| D | 223 | |
| D | 347 | |
| D | 297 | |
| D | 363 | |
| D | 273 | |
| D | 380 | |

(TEST 3)

The table 3 shows the exhaust pressure of spin dry units (units 1 to 3) connected to devices 3 to 9 when the dampers of devices 1 and 2 are closed in the conventional spin dry unit of FIG. 1, for example, TEL TRACK DEVELOPER, wherein the unit is Pa.

TABLE 3

|   | Average of | Grand mean |
|---|---|---|
| D | 330 | 333 |
| D | 280 | |
| D | 357 | |
| D | 317 | |
| D | 383 | |
| D | 280 | |
| D | 387 | |

(TEST 4)

The table 4 shows the exhaust pressure of spin dry units (units 1 to 3) connected to devices 4 to 9 when the dampers of devices 1 to 3 are closed in the conventional spin dry unit of FIG. 1, for example, TEL TRACK DEVELOPER, wherein the unit is Pa.

TABLE 4

|   | Average of | Grand mean |
|---|---|---|
| D | 317 | 349 |
| D | 370 | |
| D | 323 | |
| D | 397 | |
| D | 287 | |
| D | 400 | |

(TEST 5)

The table 5 shows the exhaust pressure of spin dry units (units 1 to 3) connected to devices 5 to 9 when the dampers of devices 1 to 4 are closed in the conventional spin dry unit of FIG. 1, for example, TEL TRACK DEVELOPER, wherein the unit is Pa.

TABLE 5

|   | Average of | Grand mean |
|---|---|---|
| D | 400 | 372 |
| D | 330 |   |
| D | 423 |   |
| D | 293 |   |
| D | 413 |   |

(TEST 6)

The table 6 shows the exhaust pressure of spin dry units (units 1 to 3) connected to devices 6 to 9 when the dampers of devices 1 to 5 are closed in the conventional spin dry unit of FIG. 1, for example, TEL TRACK DEVELOPER, wherein the unit is Pa.

TABLE 6

|   | Average of | Grand mean |
|---|---|---|
| D | 353 | 383 |
| D | 453 |   |
| D | 300 |   |
| D | 427 |   |

The following table 7 shows wind velocity, wind volume and the variation in the main duct according to the above six experiments, wherein the unit of wind velocity is M/Sec and that of wind volume is CCM.

TABLE 7

|   | Wind | Wind | Variation |
|---|---|---|---|
| Test 1 | 9.3 | 402 | 0 |
| Test 2 | 9.3 | 402 | 0 |
| Test 3 | 8.8 | 380 | −22 |
| Test 4 | 8.2 | 354 | −48 |
| Test 5 | 7.5 | 324 | −78 |
| Test 6 | 6.8 | 289 | −113 |

As described above, according to the present invention, a spin dry unit includes a trap comprising an air absorber, a damper and an auto damper, wherein normally open mode of the spin dry unit is changed into normally close mode by signal modification and recipe modification, thereby reinforcing down flow in devices with a small amount of exhaust. Therefore, the present invention has advantages that the manufacturing cost is reduced by the reduced amount of exhaust and process margin is improved by the increased exhaust pressure.

What is claimed is:

1. An apparatus for substrate cleaning of liquid crystal display having a spin dry unit performing cleaning and dry processes, wherein the spin dry unit comprise:

a spin dry cup having a rotation device for rotating substrate;

an air absorber arranged on the external of the spin dry cup to absorb impurities exhausted from the rotating substrate with air;

a trap for exhausting air and impurities absorbed from the air absorber to the external;

an exhaust pressure control part arranged in the trap to control exhaust pressure of the trap; and a drain arranged in the trap to exhaust chemicals and water from the rotating substrate to the external.

2. The apparatus for substrate cleaning according to claim 1, wherein the exhaust pressure control part comprises a manual damper for controlling the open and close by hand operation and an auto damper for automatically controlling the open and close, set to open when the substrate is loaded on the rotation device and cleaning process is performed.

3. An air absorber arranged on the external of a spin dry cup to absorb impurities exhausted from a rotating substrate with air, comprising:

a trap for exhausting air and impurities absorbed from the air absorber to the external;

an exhaust pressure control part arranged in the trap to control exhaust pressure of the trap, wherein the exhaust pressure control part comprises a manual damper for controlling the open and close by hand operation and an auto damper for automatically controlling the open and close, set to open when the substrate is loaded on the rotation device and cleaning process is performed; and a drain arranged in the trap to exhaust chemicals and water from the rotating substrate to the external.

4. A method for substrate cleaning of liquid crystal display comprising the steps of:

providing a substrate cleaning apparatus in claim 3;

loading the substrate on a rotation device; and closing a manual damper by hand operation and opening automatically a auto damper when the substrate is loaded on the rotation device and cleaning process is performed.

* * * * *